(12) United States Patent
de la Puente

(10) Patent No.: US 7,480,583 B2
(45) Date of Patent: Jan. 20, 2009

(54) METHODS AND APPARATUS FOR TESTING A CIRCUIT

(75) Inventor: Edmundo de la Puente, Cupertino, CA (US)

(73) Assignee: Verigy (Singapore) Pte. Ltd, Singapore (SG)

(*) Notice: Subject to any disclaimer, the term of this patent is extended or adjusted under 35 U.S.C. 154(b) by 0 days.

(21) Appl. No.: 11/684,446

(22) Filed: Mar. 9, 2007

(65) Prior Publication Data

US 2008/0218173 A1  Sep. 11, 2008

(51) Int. Cl.
*G06F 3/02* (2006.01)

(52) U.S. Cl. .................. 702/117; 702/118; 702/182; 702/183

(58) Field of Classification Search ............. 702/39, 702/66, 68, 71, 74, 113, 121, 117, 118, 182, 702/183; 330/10, 2; 333/186; 367/181
See application file for complete search history.

(56) References Cited

U.S. PATENT DOCUMENTS

| | | | | |
|---|---|---|---|---|
| 6,016,075 A | * | 1/2000 | Hamo | .................. 330/10 |
| 6,822,929 B1 | * | 11/2004 | Schubert et al. | ............. 367/181 |
| 7,095,295 B1 | * | 8/2006 | Stalford et al. | ............. 333/186 |

* cited by examiner

*Primary Examiner*—Eliseo Ramos-Feliciano
*Assistant Examiner*—Felix Suarez
(74) *Attorney, Agent, or Firm*—Holland & Hart, LLP

(57) ABSTRACT

In one embodiment, when a test program for testing a circuit specifies the application of a DC voltage to a particular node of the circuit, i) an operational amplifier of a circuit test system is configured to respond to remote feedback, wherein the remote feedback is responsive to a load on a circuit test system test pin that is coupled to the particular node, and ii) the DC voltage is applied to the particular node via the operational amplifier. When the test program specifies the application of a high-voltage waveform to the particular node, i) the operational amplifier is configured to respond to local feedback, wherein the local feedback is not responsive to the load on the test pin, and ii) at least a high-voltage portion of the high-voltage waveform is applied to the particular node via the operational amplifier. Other embodiments are also disclosed.

13 Claims, 5 Drawing Sheets

METHODS AND APPARATUS FOR TESTING A CIRCUIT

BACKGROUND

When testing a circuit such as a semiconductor device, a variety of different stimuli may need to be applied to the same or different nodes of the circuit. These stimuli include: low-voltage waveforms, high-voltage waveforms, and direct current (DC) voltages.

BRIEF DESCRIPTION OF THE DRAWINGS

Illustrative embodiments of the invention are illustrated in the drawings, in which.

DETAILED DESCRIPTION

Figure 1:
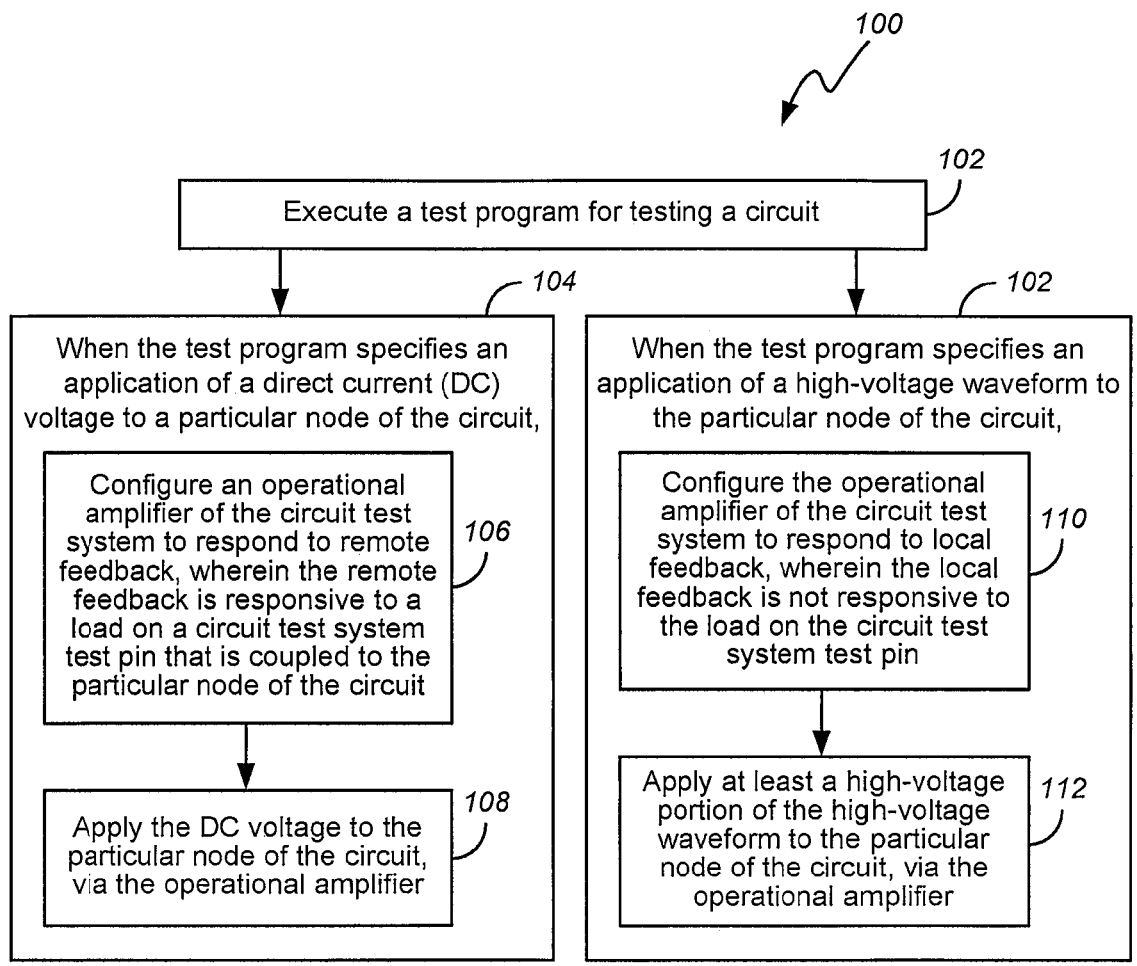
FIG. 1 illustrates an exemplary method for testing a circuit, in which a DC voltage or a high-voltage waveform can be applied to a node of a circuit.

As a preliminary manner, it is noted that, in the following description, like reference numbers appearing in different drawing figures refer to like elements/features. Often, therefore, like elements/features that appear in different drawing figures will not be described in detail with respect to each of the drawing figures.

A circuit test system interfaces to a circuit (i.e., a device under test (DUT)) via a number of test channels. Presently, test systems may provide anywhere from a few to a few thousand test channels. Usually, a test channel is capable of both providing electrical stimuli to a DUT and observing electrical responses of a DUT, although some test channels may only perform one of these functions.

Examples of electrical stimuli that may be provided to a DUT include voltage waveforms, and voltage and current stimuli for performing parametric measurements. Examples of electrical responses that may be observed in a DUT include voltage waveforms containing level and timing information, and parametric measurements.

Control systems that are embedded in (or coupled to) a circuit test system are used to generate the electrical stimuli, and process the electrical responses, that are provided or observed via test channels. In some cases, part or all of a control system may be embedded in a particular test channel, and the control system may be exclusively used by the particular test channel. In other cases, part or all of a control system may be implemented externally to a test channel, or a control system may be shared by multiple test channels.

Figure 5:
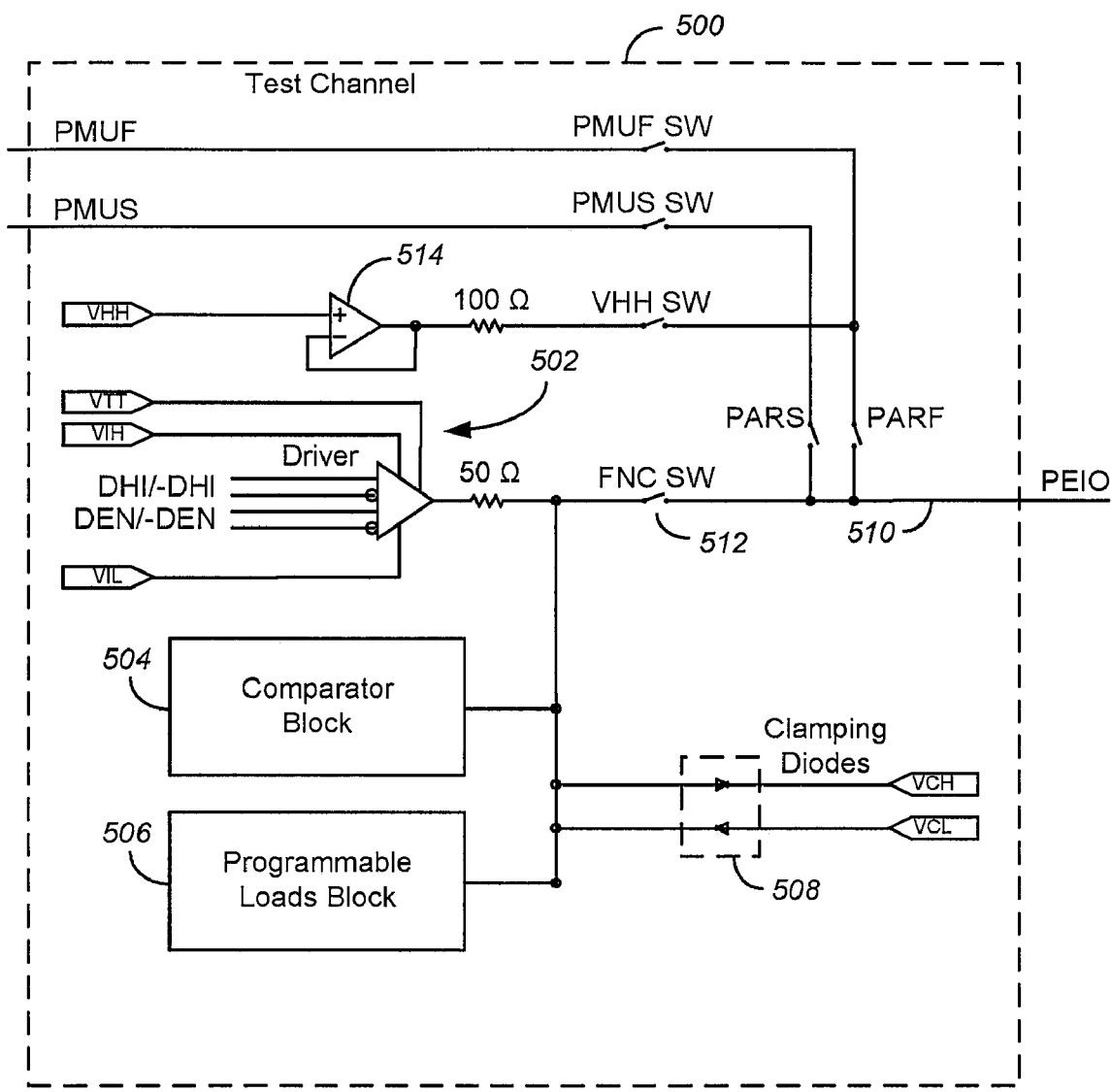
FIG. 5 illustrates an exemplary embodiment of a test system test channel.

FIG. 5 illustrates an exemplary embodiment of a test channel 500. The test channel 500 comprises a driver block 502, a comparator block 504, a programmable loads block 506, and clamping diodes 508, all of which are coupled to a test pin (labeled "PEIO", 510). A switch labeled "FNC SW" 512 serves to connect and disconnect the blocks 502, 504 and 506, and clamping diodes 508, from the test pin 510.

During circuit test, it is sometimes necessary to provide an accurate direct current (DC) voltage to one or more nodes of a DUT. These voltages might be for special test modes or just to provide biasing. Typically, a DC voltage loads a test channel with several milliamps of current. As a result, DC voltages should be provided in a way that enables them to remain accurate under load.

Some test systems provide special test channels (known as high-voltage channels) with switches that enable them to connect to DC supplies. However, there are several issues with this approach. First, both the number of DC supplies and the number of special test channels that can connect to them are limited. Thus, routing the test pins of the special channels to where they are needed to test a particular DUT can result in a complex and expensive DUT interface boards. Second, different DUTs can require the application of different numbers of DC voltages. Thus, depending on the use to which a test system is ultimately put, a test system may contain too many DC supplies, some of which sit unused, or too few DC supplies, in which test algorithms or test parallelism may be negatively impacted. Third, the additional components that are required for connecting the special test channels to the DC supplies, such as mechanical relays or analog switches, can be costly.

Other test systems are capable of providing DC voltages by leveraging the high-voltage drivers that are associated with high speed waveform drivers of particular test channels. That is, typical functional test patterns require two voltage levels: VIL and VIH (a low voltage level and a high-voltage level). In certain test modes, some or all of a system's test channels can introduce a third voltage level into a test pattern—typically a high voltage (VHH). The high voltage is typically about 13 volts (13 V), and may supply a current of about 10 milliamps (10 mA). When the driver 514 (FIG. 5) used to supply the high voltage is not switched with the VIL and VIH drivers 502 to generate a test pattern, the driver 514 can be used as a DC supply. However, a drawback to this approach is that the high-voltage driver 514 is usually 1) connected to a channel's test pin 510 via a switch, or 2) coupled to a channel's test pin 510 via a resistor. In applications where the current load is very low (on the order of micro-Amps), the voltage drop across the output impedance is negligible, and this method works. However, in cases where the current load is more substantial, the voltage drop across the output impedance makes this approach undesirable.

Still other test systems are capable of providing a DC voltage to a test channel by means of a central parametric measurement unit (PMU). This solution works well from the standpoint of providing an accurate DC voltage, because the central PMU has force and sense connections that are capable of compensating for any sort of voltage drop in a test channel's output impedance. However, an issue with using a central PMU is that there is typically one PMU per a large number of test channels (e.g., a 1:32 ratio in some systems). This means that a test designer can only provide DC voltages to a limited number of test pins. In addition, the use of a PMU to provide a DC voltage means the PMU is unavailable to perform its main function, which is to perform parametric measurements (e.g., voltage or current measurements).

One last approach is to provide a per-pin measurement unit (PPMU). That is, some test systems have a PMU built into every test channel. Thus, if a DC voltage is needed on a particular test pin, the PPMU of the pin's test channel can be configured to provide the voltage. However, PPMU complexity adds significant cost to a test system. PPMU implementation also consumes a lot of physical area, which can be a hindrance given the typical need to provide a lot of test channels in close proximity to one another.

FIG. 1 illustrates a new method 100 for testing a circuit, in which a DC voltage or a high-voltage waveform can be applied to a node of a circuit. In accord with the method 100, a test program is executed for a circuit under test (at block 102). When the test program specifies an application of a DC voltage to a particular node of the circuit (at block 104), an operational amplifier of a circuit test system is configured to respond to "remote feedback", which is feedback responsive to a load on a circuit test system test pin that is coupled to the particular node of the circuit. See, block 106. The DC voltage is then applied to the particular node of the circuit via the operational amplifier (at block 108). However, when the test program specifies an application of a high-voltage waveform to the particular node of the circuit (at block 110), the operational amplifier of the circuit test system is configured to respond to "local feedback", which is feedback that is not responsive to the load on the circuit test system test pin. See, block 112. At least a high-voltage portion of the high-voltage waveform is then applied to the particular node of the circuit via the operational amplifier (at block 114).

When the test program executed by the method 100 specifies the application of DC voltages and high-voltage waveforms to different nodes of a circuit, the method's configuring and applying steps 104, 106, 110, 112 can be independently executed for each of a plurality of tests pins of the circuit test system.

Figure 2:
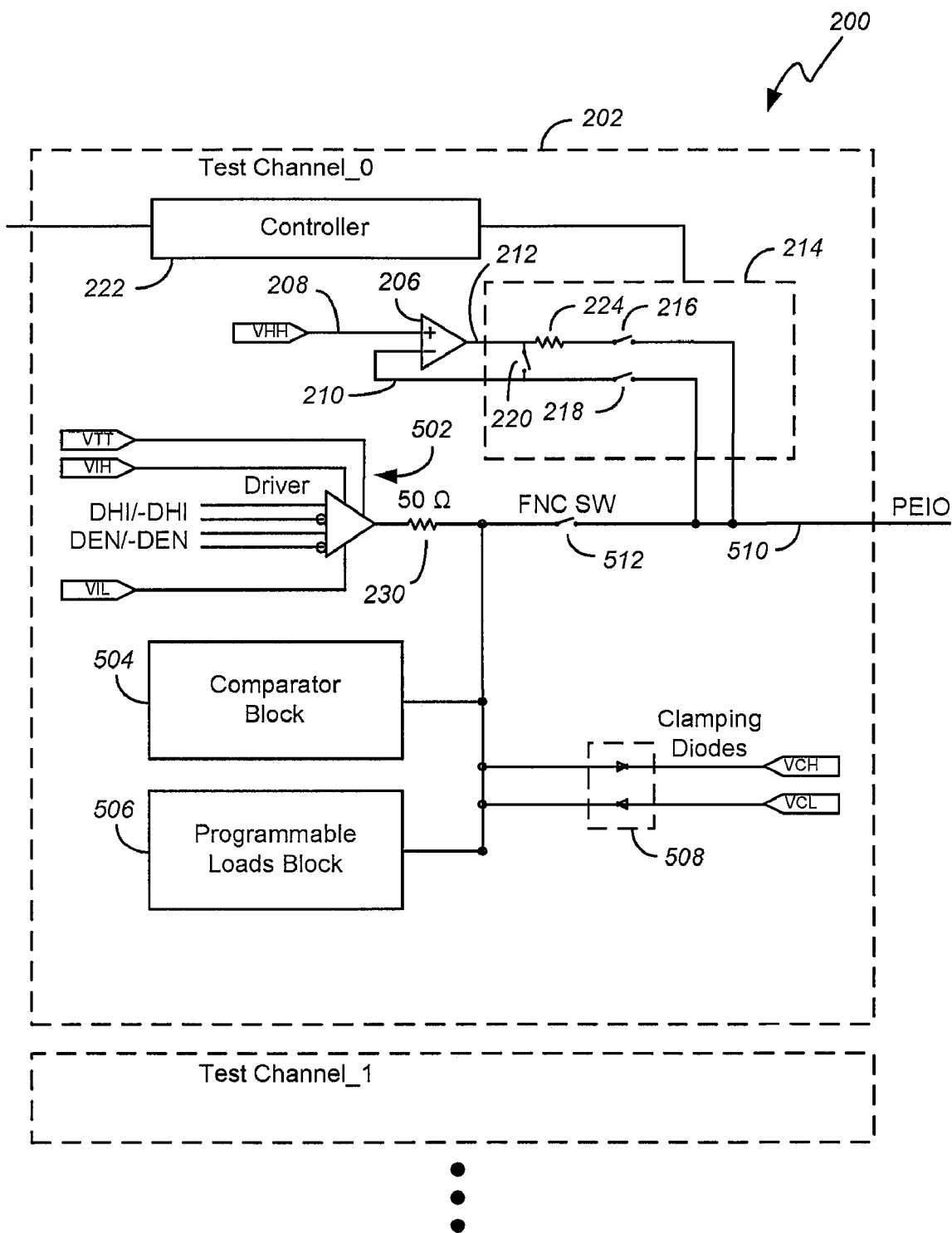
FIGS. 2-4 illustrate various exemplary embodiments of apparatus that can be used to implement the method shown in FIG. 1.

FIG. 2 illustrates a first exemplary embodiment 200 of apparatus that may be used to test a circuit using the method 100 (or other methods). The apparatus 200 comprises a test channel 202 that terminates in a test pin 510 for testing a circuit. The test channel 202 comprises an operational amplifier 206 having a test voltage input 208 and a feedback input 210. The operational amplifier 206 also has a test voltage output 212 for alternately providing 1) a DC voltage, or 2) at least a high-voltage portion of a high-voltage waveform, to the test pin 510. The test channel 202 further comprises a switching network 214 having a number of switches (e.g., switches 216, 218, 220) that are configurable to, in a DC voltage mode, couple the test voltage output 212 to the feedback input 210 via a remote feedback path that traverses the test pin 510. This may be done, for example, by closing switches 216 and 218 and opening switch 220. The switches 216, 218, 220 of the switching network 214 are also configurable to, in a high-voltage waveform mode, couple the test voltage output 212 to the feedback input 210 via a local feedback path that does not traverse the test pin 510. This may be done, for example, by closing switches 216 and 220 and opening switch 218.

A controller 222 provided as part of, or externally to, the test channel 202 may be configured to, in response to a test program, operate the switching network 214 in accord with its different modes. The same or different controller may also be configured to drive a programmable test voltage to the test voltage input 208 of the test channel 202.

In its DC voltage mode, the apparatus 200, via the operational amplifier 206, uses a Kelvin sense approach to 1) compensate for the voltage drop across the output switch 216 and output resistance 224, and 2) provide an accurate DC voltage to the test pin 510. However, in its high-voltage waveform mode, the apparatus 200, via the same operational amplifier 206, is capable of driving a relatively high-speed, high-voltage waveform to the test pin 510. In one embodiment, the high-voltage waveform could be formed by alternately closing the switches 216 and 512, to alternately couple the operational amplifier 206 and a voltage driver 502 to the test pin 510.

Figure 3:
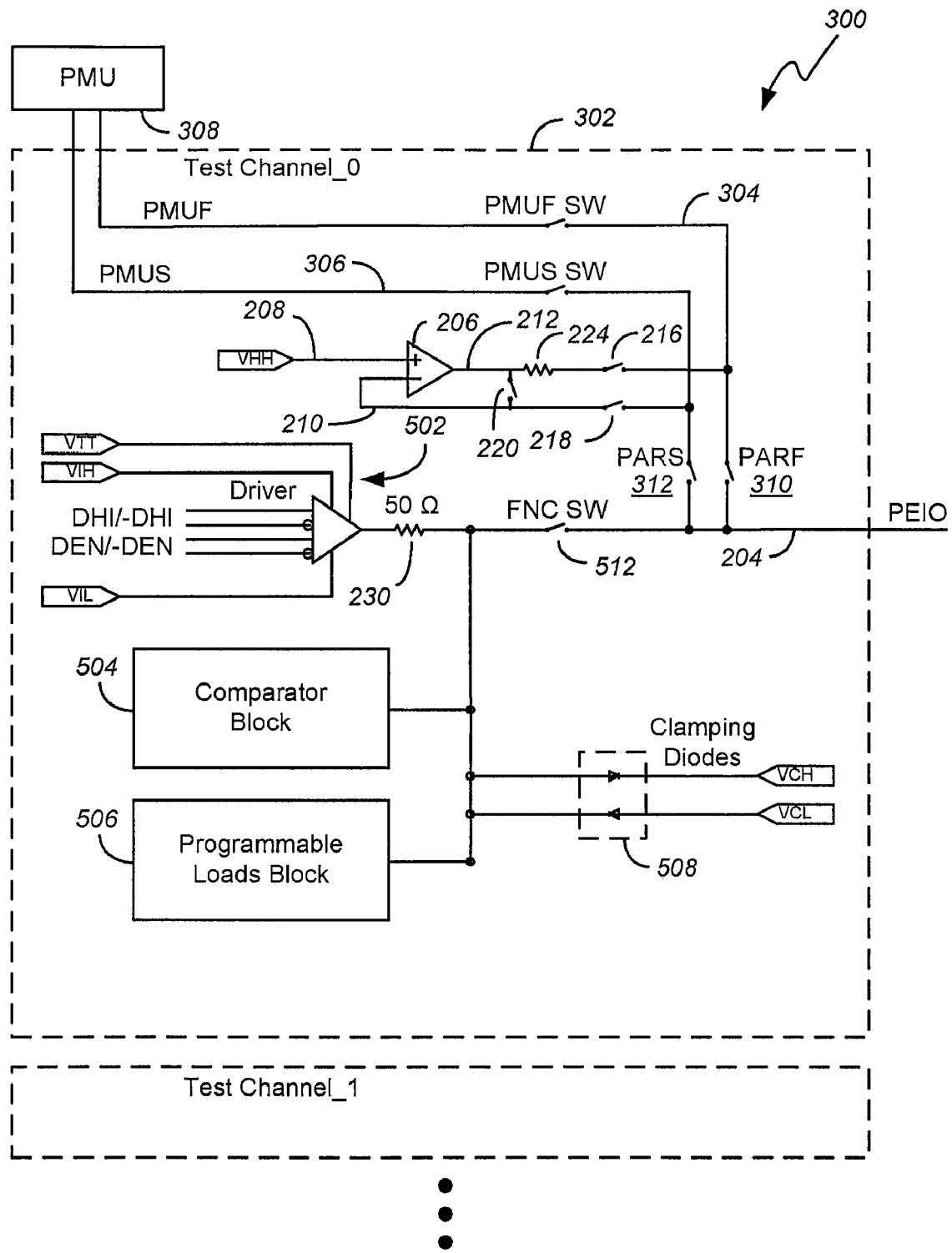

FIG. 3 illustrates a variation 300 of the apparatus 200 wherein the switches 216, 218 that couple the operational amplifier 206 to the test pin 510 instead couple the operational amplifier 206 to the force and sense lines 304, 306, respectively, of a PMU 308 having a parametric voltage force and a parametric voltage sense. The force line 304 comprises a parametric voltage force (PARF) switch 310 for coupling the force line 304 to the test pin 510, and the sense line 306 comprises a parametric voltage sense (PARS) switch 312 for coupling the sense line 306 to the test pin 510. Of note, the switches 216, 218 for coupling the operational amplifier 206 to the force and sense lines 304, 306 are positioned on sides of the switches 310, 312 opposite the test pin 510. In this manner, the output impedance of a test channel 302 that provides both parametric measurement and DC voltage capabilities can be minimized (i.e., only one set of switches 310/312 places a direct load on the test pin 510).

Figure 4:
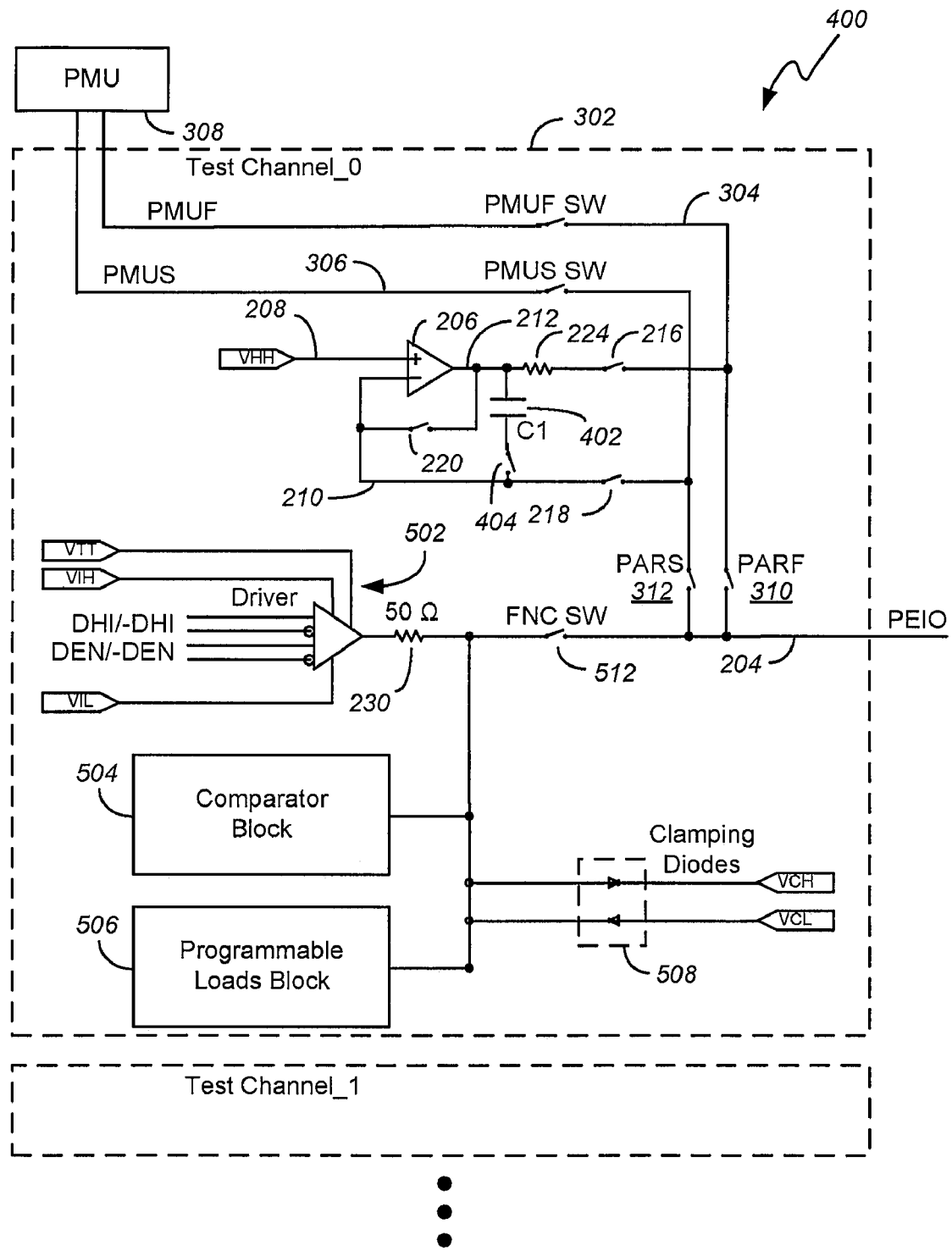

FIG. 4 illustrates a further improvement that may be made to the apparatus 200 or 300. By way of example, the improvement is shown as an improvement to the apparatus 300. The improvement comprises a capacitor 402 (also labeled "C1"), coupled in series with a switch 404 between the test voltage output 212 and feedback input 210 of the operational amplifier 206. Of note, the series capacitor 402 and switch 404 are coupled in parallel with the switch 220. During the DC voltage mode of the apparatus 400, the switches 216, 218, 310 and 312 are closed, and the switch 220 is opened, to couple the operational amplifier 206 to the test pin 510. In addition, switch 404 is closed to couple the capacitor 402 between the test voltage output 212 and feedback input 210 of the operational amplifier 206. The capacitor 402 serves a couple of purposes. First, the value of the capacitor 402 determines the amount of load capacitance that can be driven. The load capacitance is typically on the order of a few hundred picofarads (~200 pF) and comprises capacitance contributed by the switches 216, 218, 310 and 312, as well as the test pin 510. Second, the capacitor 402 slows down the responsiveness of the remote feedback loop, thereby providing a more slowly changing, and therefore more stable, DC voltage at the test pin 510.

During the high-voltage waveform mode of the apparatus 400, the switches 216, 220 and 310 are closed, and the switches 218 and 312 are opened, to couple the operational amplifier 206 to the test pin 510. In addition, switch 404 is opened to de-couple the capacitor 402 from between the test voltage output 212 and feedback input 210 of the operational amplifier 206. The capacitor 402 is de-coupled because compensation for the lower output capacitance in the high-voltage waveform mode should not be necessary, and de-coupling the capacitor 402 can improve the slew rate of the high-level voltage delivered to the test pin 510.

As previously mentioned, one way to form a high-voltage waveform is to alternately couple the operational amplifier 206 and a voltage driver 502 to the test pin 510. In some cases, both high and low digital voltage levels (VIH and VIL) may be generated by the voltage driver 502, and a "high-voltage" level (VHH) can be generated by the operational amplifier 206. The high-voltage level can be switched to the test pin 510 via the switch 216 (or the switches 216 and 310). The resultant VIL-VIH-VHH waveform can be generated on-the-fly, with the timing sequence of when to switch from one level to another being controlled by a test system's pattern and timing generators.

The voltage driver 502 will typically be a high speed driver, and the types of signals generated during the afore-mentioned VIL-VIH-VHH tri-level mode will usually be fast slewing. For example, VIL-VIH-VIL transitions may range from a few hundred picoseconds to a few nanoseconds (although driving into VHH from either VIL or VIH may be slower, on the order of about hundred nanoseconds).

As a result of the driver 502 being a high speed driver, the output lines of a test channel's pin electronics (e.g., line 204) are typically 50 Ohm transmission lines, and there is normally no load other than the DUT input capacitance (~5 pF) and a small DC load (~few microamps of current). To minimize multiple reflected waveforms, the line 204 may employ a 50 Ohm resistor 230 to serially terminate the line (i.e., a back-matched impedance).

Because the operational amplifier 206 (i.e., VHH driver) is somewhat slower than the driver 502, and because the output line 204 is typically connected to small loads during the high-voltage waveform mode, the operational amplifier 206 may drive larger output impedances. These impedances are typically the collective ON resistance of the switches 216, 310 connecting VHH to the test pin 510. This impedance is typically around 70-150 Ohms. This works okay for the high speed environment, because the switching speed between VIH/VIL to VHH is slow, and any reflections in the line will typically not appear even though there is a source impedance mismatch. A larger ON resistance in the switch 310 is advantageous because it drives the switch size down, which in turn lowers the parasitic capacitance seen at the test pin 510.

If desired, any of the test channels 200, 300, 400 shown in FIGS. 2-4 can be replicated for each of a test system's test channels, and a DC supply can be provided for each of a test system's channels with little increase in cost or area over a test channel that already provides a high-voltage waveform driver.

Preferably, the operational amplifier 206, switches 216, 218, 220, 310, 312, 404, and optional capacitor 402 for a particular test channel are formed on a single integrated circuit. In this manner, external field-effect transistor (FET) switches or mechanical relays can be avoided, and a test system's overall cost and reliability can be increased. And, if the pin electronics for a test channel are already implemented via an integrated circuit, the addition of a few switches and a capacitor to the existing integrated circuit makes per-pin cost increases negligible.

Given the low per-pin cost of the solutions disclosed herein, the hardware for providing an accurate DC voltage to a test pin may be incorporated into each of a test system's test channels (or any subset thereof). If the hardware is built into every test channel, DUT interface and probe card designs and layouts are simplified, because a user can provide a DC voltage to a DUT via any test channel that is easily connected to the DUT (e.g., a test channel that is closest to a circuit node to which the DC voltage needs to be applied). Also, test programs can be designed to incorporate any test or test parallelism that is deemed to be useful, without limitations on how many DC voltages can be provided, or where they can be provided. Further, central PMUs and advanced power supply resources can be freed from the task of supplying simple DC voltages, and can instead be used for more advanced (and intended) tasks.

What is claimed is:

1. A method for testing a circuit, comprising:
executing a test program for testing the circuit;
when the test program specifies an application of a direct current (DC) voltage to a particular node of the circuit, i) configuring an operational amplifier of the circuit test system to respond to remote feedback, wherein the remote feedback is responsive to a load on a circuit test system test pin that is coupled to the particular node of the circuit, and ii) applying the DC voltage to the particular node of the circuit via the operational amplifier; and when the test program specifies an application of a high-voltage waveform to the particular node of the circuit, i) configuring the operational amplifier of the circuit test system to respond to local feedback, wherein the local feedback is not responsive to the load on the circuit test system test pin, and ii) applying at least a high-voltage portion of the high-voltage waveform to the particular node of the circuit via the operational amplifier.

2. The method of claim 1, further comprising:
as the test program specifies applications of DC voltages and high-voltage waveforms to different nodes of the circuit, independently executing said configuring and applying steps for each of a plurality of tests pins of the circuit test system.

3. Apparatus for testing a circuit, comprising:
a test channel terminating in a test pin for testing the circuit, the test channel having,
an operational amplifier having a test voltage input, a feedback input, and a test voltage output for alternately providing i) a DC voltage, or ii) at least a high-voltage portion of a high-voltage waveform, to the test pin; and
a switching network having a number of switches that are configurable to i) in a direct current (DC) voltage mode, couple the test voltage output to the feedback input via a remote feedback path that traverses the test pin, and ii) in a high-voltage waveform mode, couple the test voltage output to the feedback input via a local feedback path that does not traverse the test pin.

4. The apparatus of claim 3, further comprising a controller, configured to operate the switching network in accord with the DC voltage mode and the high-voltage waveform mode.

5. The apparatus of claim 3, wherein the operational amplifier and switching network are formed on a single integrated circuit.

6. The apparatus of claim 3, further comprising a capacitor, wherein the number of switches of the switching network are further configurable to i) in the DC voltage mode, couple the capacitor between the test voltage output and the feedback input, and ii) in the high-voltage waveform mode, de-couple the capacitor from between the test voltage output and the feedback input.

7. Apparatus for testing a circuit, comprising:
a plurality of test channels, each test channel terminating in one of a plurality of test pins for testing the circuit, and each test channel having,
an operational amplifier having a test voltage input, a feedback input, and a test voltage output;
a capacitor and a first switch, coupled in series between the test voltage output and the feedback input;
a second switch, coupled in parallel with the capacitor and first switch, between the test voltage output and the feedback input;
a third switch to couple the test voltage output to a corresponding one of the test pins; and
a fourth switch to couple the feedback input to the corresponding one of the test pins.

8. The apparatus of claim 7, wherein the operational amplifier, capacitor, and first, second, third and fourth switches of a given test channel are formed on a single integrated circuit, and wherein the operational amplifiers, capacitor, and first, second, third and fourth switches of different test channels are formed on different integrated circuits.

9. The apparatus of claim 7, further comprising a controller to place ones of the test channels in a high-voltage waveform mode or a direct current (DC) voltage mode, wherein the controller is configured to i) place a given one of the test channels in the high-voltage waveform mode by causing the second and third switches of the given test channel to close, and causing the first and fourth switches of the given test channel to open, and ii) place the given one of the test channels in the DC voltage mode by causing the first, third and fourth switches of the given test channel to close, and causing the second switch of the given test channel to open.

10. The apparatus of claim 7, further comprising:
a parametric measurement unit having a parametric voltage force and a parametric voltage sense;
wherein each of the test channels has,
a parametric voltage force switch to couple the test channel's test pin to both the third switch and the parametric voltage force; and
a parametric voltage sense switch to couple the test channel's test pin to both the fourth switch and the parametric voltage sense.

11. The apparatus of claim 7, wherein the controller is further configured to, in response to a test program, drive a programmable test voltage to the test voltage input of a particular test channel.

12. The apparatus of claim 7, wherein the plurality of test channels is all of the test channels of a circuit test system.

13. The apparatus of claim 7, wherein the plurality of test channels includes only some of the test channels of a circuit test system.

* * * * *